US008286341B2

(12) United States Patent
Palm et al.

(10) Patent No.: US 8,286,341 B2
(45) Date of Patent: Oct. 16, 2012

(54) METHOD OF MANUFACTURING A WIRING BOARD

(75) Inventors: Petteri Palm, Espoo (FI); Arni Kujala, Espoo (FI)

(73) Assignee: Imbera Electronics Oy, Espoo (FI)

( * ) Notice: Subject to any disclaimer, the term of this patent is extended or adjusted under 35 U.S.C. 154(b) by 517 days.

(21) Appl. No.: 12/420,617

(22) Filed: Apr. 8, 2009

(65) Prior Publication Data

US 2009/0260866 A1    Oct. 22, 2009

(30) Foreign Application Priority Data

Apr. 18, 2008   (FI) ...................................... 20085332

(51) Int. Cl.
    *H05K 3/30*    (2006.01)
(52) U.S. Cl. .................. 29/832; 29/825; 29/840; 29/841
(58) Field of Classification Search ............... 29/825, 29/832, 840, 841
    See application file for complete search history.

(56) References Cited

U.S. PATENT DOCUMENTS

| 3,650,648 | A | * | 3/1972 | Lambrecht | ................. 425/129.1 |
| 3,739,438 | A | * | 6/1973 | Lambrecht | ................. 29/25.42 |
| 6,210,518 | B1 | | 4/2001 | Lee et al. | |
| 7,594,317 | B2 | | 9/2009 | Nakamura | |
| 2003/0011049 | A1 | | 1/2003 | Nuytkens et al. | |
| 2005/0155222 | A1 | | 7/2005 | Nakamura | |
| 2006/0021791 | A1 | | 2/2006 | Sunohara et al. | |
| 2007/0124924 | A1 | | 6/2007 | Nakamura | |
| 2007/0143992 | A1 | * | 6/2007 | Kyouzuka | ..................... 29/830 |
| 2007/0245551 | A1 | | 10/2007 | Yeh | |

FOREIGN PATENT DOCUMENTS

| JP | 1-248685 | 4/1989 |
| JP | 07-273424 | 10/1995 |
| KR | 10-2006-0063963 | 6/2006 |
| KR | 10-2007-0059996 | 6/2007 |
| WO | WO 2005/027223 | 3/2005 |

OTHER PUBLICATIONS

Korean Office Action for Application No. 10-2009-0033075 mailed Mar. 23, 2012.

* cited by examiner

*Primary Examiner* — Carl Arbes
(74) *Attorney, Agent, or Firm* — Merchant & Gould P.C.

(57) ABSTRACT

A method for manufacturing a wiring board, comprising the steps of mounting at least one structural aid on each side of a planar temporary bonding means, arranging a slot from the at least one structural aid on each side of the planar temporary bonding means, embedding the electrical component in the slot, such that the terminals of the electrical component face away from the planar temporary bonding means, mounting at least one electrical component on a component foil, such that the terminals of the electrical component face the component foil, mounting the component foil at least partially on the at least one structural aid, on each side of the planar temporary bonding means.

8 Claims, 10 Drawing Sheets

METHOD OF MANUFACTURING A WIRING BOARD

This application claims benefit of Serial No. 20085332, filed 18 Apr. 2008 in Finland and which application is incorporated herein by reference. To the extent appropriate, a claim of priority is made to the above disclosed application.

FIELD OF THE INVENTION

The present invention relates to wiring board technology. Especially the present invention relates to a wiring board and a method for manufacturing a wiring board with an electrical component, using a planar temporary bonding means.

BACKGROUND OF THE INVENTION

Important aspects of state-of-the-art wiring boards and methods for their manufacturing include dense mounting of semiconductor chips enabling small lateral and vertical dimensions, and robustness including reliable electrical contacts and flatness to ensure good alignment of features during lithographic processing. Furthermore the production process to manufacture the wiring boards should be as cost-effective as possible especially in mass production. This cost effectiveness is also related to the packaging density of components on the wiring board.

A common problem with wiring boards is warping as a result of the manufacturing process. The warping may be caused e.g. during thermal treatment of the wiring board by differences between thermal expansion coefficients of layers of different materials in the wiring board structure. Various methods and structures have been proposed in order to reduce warping of a wiring board. For example US20060021791 proposes to use a specific placement of components on the wiring board and JP1248685 discloses a wiring board structure which has additional layers in the structure to manipulate its thermal expansion characteristics.

A problem with prior-art approaches, including the aforementioned publications, in reducing warping of the wiring board is that they impose restrictions on the design of wiring boards. These restrictions may concern e.g. the relative placement of insulating and conductive layers, the minimum thickness of the wiring board and the placement of integrated components on the wiring board. Another problem with solutions of the prior art is that they complicate the manufacturing process and thereby decrease its throughput and cost-effectiveness. Reduced flexibility in the design of wiring boards may also compromise the reliability of electrical connections in the wiring board.

PURPOSE OF THE INVENTION

The purpose of the present invention is to reduce the aforementioned technical problems of the prior art by providing a new type of wiring board and a new type of method for manufacturing a wiring board.

SUMMARY OF THE INVENTION

The method according to the present invention is characterized by what is presented in independent claim 1.

The product according to the present invention is characterized by what is presented in independent claim 9.

A method for manufacturing a wiring board according to the present invention comprises the steps of mounting at least one structural aid on each side of a planar temporary bonding means, arranging a slot for an electrical component from the at least one structural aid on each side of the planar temporary bonding means, embedding the electrical component in the slot, such that the terminals of the electrical component face away from the planar temporary bonding means, mounting at least one electrical component on a component foil, such that the terminals of the electrical component face the component foil, mounting the component foil at least partially on the at least one structural aid, on each side of the planar temporary bonding means, and separating the at least one structural aids on each side of the planar temporary bonding means from each other.

A wiring board according to the present invention comprises at least one electrical component, a first structural aid and a second structural aid. The wiring board further comprises a planar temporary bonding means in between the first structural aid and the second structural aid, and a component foil mounted on the at least one electrical component which is embedded in a slot for an electrical component, wherein a slot is formed on each side of the planar temporary bonding means using a structural aid, and the component foil at least partly covers the structural aid from the side farther away from the planar temporary bonding means, and the terminals of the electrical component face away from the planar temporary bonding means.

The manufacturing method according to the present invention enables the fabrication of an essentially symmetrical double-sided structure for the wiring board. In this method the electrical components can be embedded in the wiring board structure while the fabrication of wiring patterns on each side of the structure can be done on an essentially symmetrical double-sided structure, before the step of separating the structural aids, i.e. before separating the individual sides of the double-sided structure. When a symmetrical structure like this goes through heat-treating or annealing, warping of the structure can be minimized as the coefficient of thermal expansion can be made essentially same on each side of the plane of symmetry. This makes the fabrication process relatively simple and also results in a reliable, mechanically and electrically robust, wiring board structure. Additionally the method of the present invention does not impose limitations to the design of the wiring board structure; benefits of the method and of the structure can be obtained as long as the coefficients of thermal expansion are similar on each side of one double-sided structure. The double-sided product according to the present invention may be used e.g. as a base structure and a specific wiring configuration may be processed on each side of this base structure by using e.g. conventional lithography and deposition techniques such as laser patterning, chemical etching, electroless coating, electrolytic deposition or various thin-film deposition techniques such as CVD or PECVD. The fabrication of wiring patterns on each side of the structure can be done before the step of separating the structural aids, i.e. before separating the individual sides of the double-sided structure.

In one embodiment of the present invention the structural aid is a molding resin sheet, for embedding the electrical component into the slot in the molding resin sheet. When a molding resin sheet is utilized as the structural aid an electrical component can be embedded in a slot conforming to the shape of the component. In this way the material surrounding the electrical component is essentially the same all around the component and the wiring board structure can be made very homogenous resulting in e.g. a very homogenous coefficient for thermal expansion. This further helps minimizing warpage of the wiring board structure. Additional benefits of using a molding resin sheet as the structural aid are reduced mechanical stresses caused by possible temperature changes in the structure, and the ability to use small component-to-component distances which can be used to reduce the width and thickness of a wiring board module. The molding resin sheet also enables a simple wiring board structure and a simple process flow for fabricating the wiring board.

In one embodiment of the present invention the planar temporary bonding means is a foil.

In one embodiment of the present invention the method comprises the step of mounting a structural layer on each side of the planar temporary bonding means in between the at least one structural aid and the planar temporary bonding means.

In another embodiment of the present invention the surface area of the planar temporary bonding means is smaller than the surface area of the structural layer mounted on each side of the planar temporary bonding means, such that the structural layers on each side of the planar temporary bonding means are in direct contact with each other at a peripheral portion of the structural layers.

In yet another embodiment of the present invention the method according to the present invention comprises the step of bonding the structural layers on each side of the planar temporary bonding means together at a peripheral portion of the structural layers.

Confining the bonding of the structural layers on each side of the planar temporary bonding means to a peripheral portion (region) around this bonding means facilitates the separation of the structural layers and thereby the structural aids on each side of the planar temporary bonding means from each other.

In one embodiment of the present invention the structural layers and/or the at least one structural aid are polymer or polymeric composite.

In another embodiment of the present invention the method according to the present invention comprises the step of at least partly encapsulating the at least one electrical component in filling material by heat-treating the structural layer and/or the at least one structural aid in which the at least one electrical component is embedded.

The method according to the present invention enables a wiring board structure in which an electrical component is embedded in the structure formed by the structural layer and/or by the at least one structural aid, and is electrically connected to the conductors on the surface of the structure. This embedded structure enhances the mechanical stability of the wiring board, and provides protection for the embedded electrical components from environment. An embedded structure furthermore enables reducing the final thickness of an assembled wiring board structure. Another advantage of the method according to the present invention is that it does not require developing new processing equipment but the method may be carried out in many existing production lines with minor modifications to the hardware.

The embodiments of the invention described hereinbefore may be used in any combination with each other. Several of the embodiments may be combined together to form a further embodiment of the invention. A method or a product, to which the invention is related, may comprise at least one of the embodiments of the invention described hereinbefore.

DETAILED DESCRIPTION OF THE INVENTION

In the following, the present invention will be described in more detail with references to the accompanying figures, in which.

For reasons of simplicity, item numbers will be maintained in the following exemplary embodiments in the case of repeating components.

It is noted that the disclosed wiring board structures have only two sides, and therefore the expression "each side" should be understood as not referring to the sides at the edges of the structures.

FIGS. 1 to 9 schematically illustrate a manufacturing process of a wiring board structure according to a first embodiment of the present invention. Each figure presents a cross sectional view of the wiring board structure in one step of the manufacturing process. The order of the figures corresponds to the order of the process steps in the manufacturing process.

Figure 1:
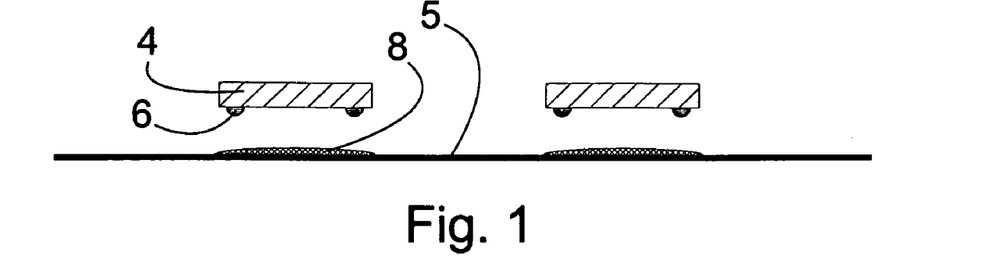
FIG. 1 is a first view of a schematic illustration of a method according to a first embodiment of the present invention.
Figure 2:
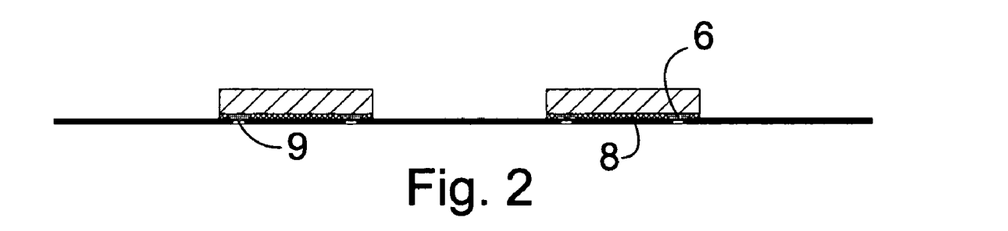
FIG. 2 is a second view of a schematic illustration of a method according to a first embodiment of the present invention.

FIGS. 1 and 2 present how an electrical component 4 is placed onto an insulating component foil 5. Epoxy resin 8 is spread onto the insulating component foil 5 in places where the electrical components 4 are to be bonded or otherwise placed to the foil 5. The electrical components 4 are placed onto the insulating component foil 5 such that the terminals 6 of the electrical components 4 face the insulating component foil 5. After the epoxy 8 under the electrical component 4 is cured and the positions of the chips 4 are fixed on the insulating component foil 5, the insulating component foil 5 is selectively removed such that the terminals 6 of the electrical components 4 are exposed. Vias 9 under the terminals 6 may be formed by removing the insulating component foil 5 under the terminals 6 by e.g. chemical etching after photolithography, or laser patterning.

Figure 3:
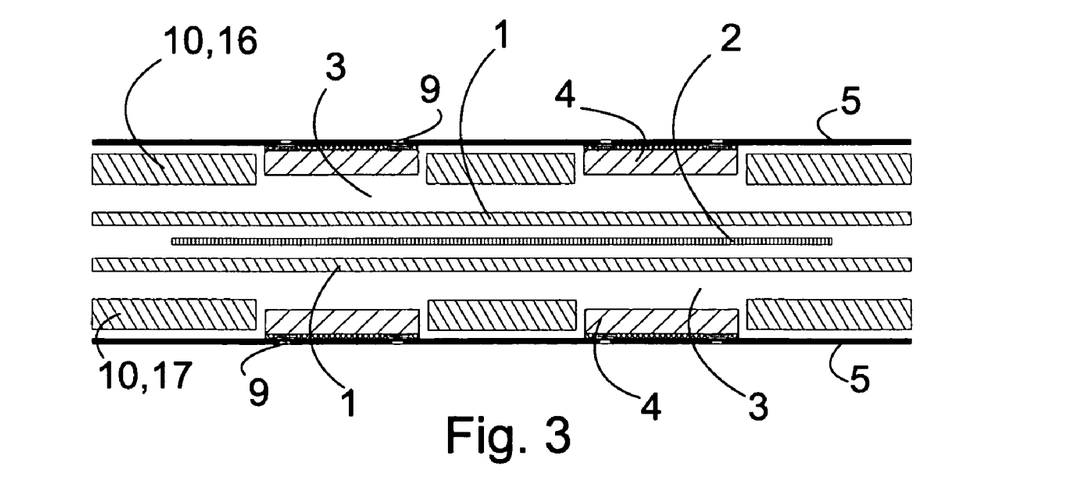
FIG. 3 is a third view of a schematic illustration of a method according to a first embodiment of the present invention.

In FIG. 3 two insulating component foils 5 comprising the bonded electrical components 4 are placed on opposite sides of a planar temporary bonding means 2 such that the terminals 6 of the electrical components 4 face away from the planar temporary bonding means 2. The insulating component foils 5 on each side of the symmetrical double-sided structure cover the structure at this stage of the manufacturing process. On each side of the planar temporary bonding means 2 there is a structural layer 1 which may be of e.g. prepreg material or other cured or uncured polymeric composite material comprising epoxy resin and reinforcing fiber, or polymer. The structural layers 1 may have a larger surface area than the planar temporary bonding means 2 such that the peripheral portion of the structural layers 1 extends outside the planar temporary bonding means 2. The planar temporary bonding means 2 in this embodiment of the invention is a foil having a suitable adhesion or no adhesion to the structural layers 1. This adhesion may be weak or even close to zero to the structural layers 1 to enable a relatively effortless separation of the two sides of the symmetrical double-side structure at a later part of the manufacturing process.

FIG. 3 presents the geometry of the wiring board structure where slots 3 are arranged for the electrical components 4 to be embedded in the structure. The slots 3 may be arranged for e.g. individual components or for a group of components by suitably placing structural aids 10 around the electrical components 4. The structural aids 10 may be e.g. of the same material as the structural layers 1. It is also noted that a structural aid 10 presented in the exemplary embodiments of the invention may further be formed from several smaller structural entities such as e.g. thin layers.

Figure 4:
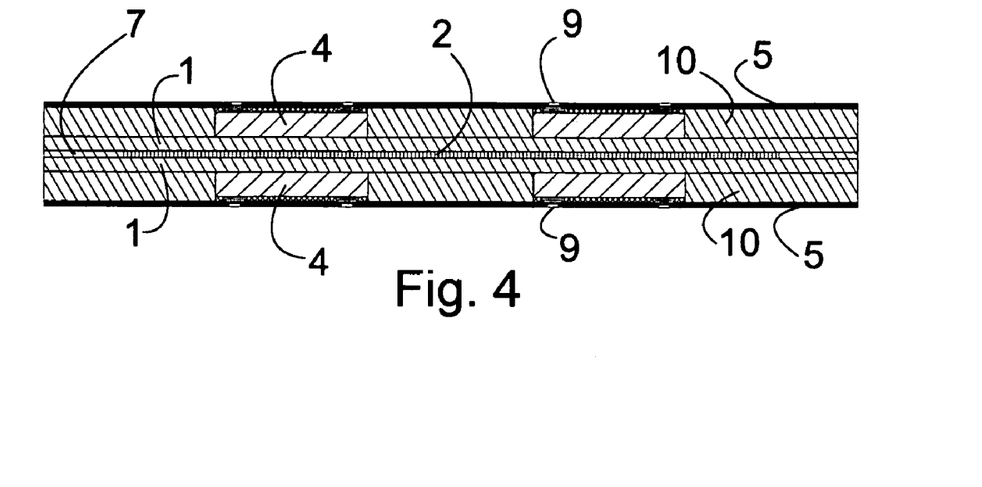
FIG. 4 is a fourth view of a schematic illustration of a method according to a first embodiment of the present invention.

As heat is applied to the layered structure of FIG. 3 and the structure is put under compressive pressure in the vertical direction, the various components of the wiring board structure presented FIG. 3, including the polymeric composite materials i.e. the structural layers 1 and the structural aids 10 (comprising a first structural aid 16 and a second structural aid 17), may be merged together to form a solid wiring board structure as presented in FIG. 4. In the structure of FIG. 4 the structural layers 1 on each side of the planar temporary bonding means 2 are bonded to each other in the peripheral portion 7 of the structural layers 1 which extends outside the planar temporary bonding means 2. The electrical components 4 are embedded in the slots 3 formed by the structural layers 1 and the structural aids 10. During the application of compressive vertically directed pressure and heat, the epoxy resin or other suitable filling material in the polymeric composite of the structural layers 1 and/or in the structural aids 10 at least partially fills the slots 3 in which the electrical components 4 are embedded, and at least partially encapsulates the electrical components 4 into epoxy or the other suitable filling material. This further enforces and improves the mechanical stability of the wiring board structure. During this process step the structural aids 10 and the structural layers 1 may all be bonded together to form a solid interior part for the structure.

The exact way of stacking and bonding the various parts of the structure of FIG. 3 together to form the merged structure of FIG. 4 can vary. Structural layers 1 and structural aids 10, made of prepreg material, can, in one embodiment of the invention, all be uncured when they are stacked together. Subsequently heat and compressive pressure are applied to the whole stacked structure to make the structural aids 10, the structural layers 1 and the other parts of the structure bond to each other and to cure them together. In another embodiment of the invention, structural layers 1, made of prepreg material, can first be stacked on each side of the planar temporary bonding 2 means in an uncured state. Heat and compressive pressure are then applied to this "core" of the structure of FIG. 4 to bond and cure the structural layers 1 together on each side of the planar temporary bonding means 2. Only after forming this "core" structure, the structural aids 10 and the other parts of the structure of FIG. 4 are stacked together, compressed and heated, to make the structural aids 10 cure and bond the "core", i.e. the structural layers 1 and the planar temporary bonding means 2 (comprising e.g. a release film), to the component foils 5 and to the electrical components 4 of the structure of FIG. 4.

Figure 5:
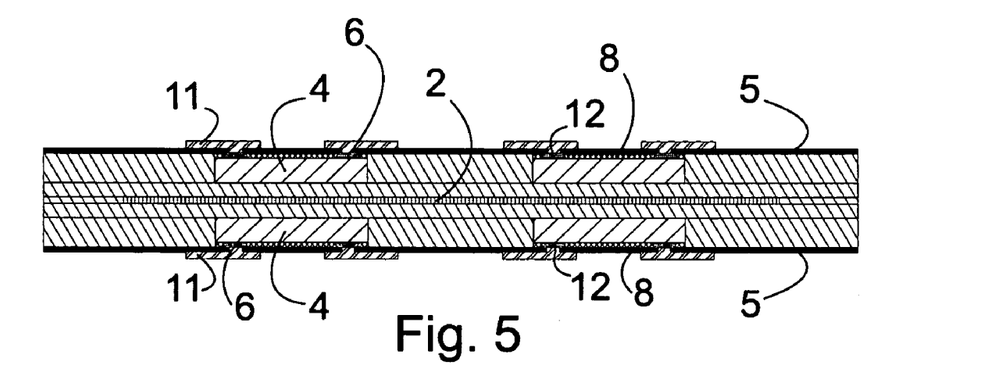
FIG. 5 is a fifth view of a schematic illustration of a method according to a first embodiment of the present invention.

In the structure of FIG. 5 electrical contacts 11 are fabricated to the exposed terminals 6 of the electrical components 4. This has been done by coating the structure of FIG. 4 from each side by a conductive layer e.g. copper, and patterning the conductive layer to form a specified wiring pattern and/or electrical contacts 11 on the insulating component foil 5. The conductive layer may be fabricated by e.g. electroless coating, electrolytic deposition or various thin-film deposition techniques such as CVD or PECVD. Patterning of the conductive layer may be performed e.g. using laser patterning or chemical etching after photolithography. During the fabrication of the electrical contacts 11 the conductive layer fills the vias 9 formed in the insulating component foil 5. The surfaces of the contact regions 12 may be cleaned by e.g. laser treatment and/or chemical etching, and coated by a thin layer of different material (e.g. palladium) prior to the deposition of the conductive layer, to decrease the contact resistance and to increase adhesion of the electrical contacts 11 and to improve their stability.

Figure 6:
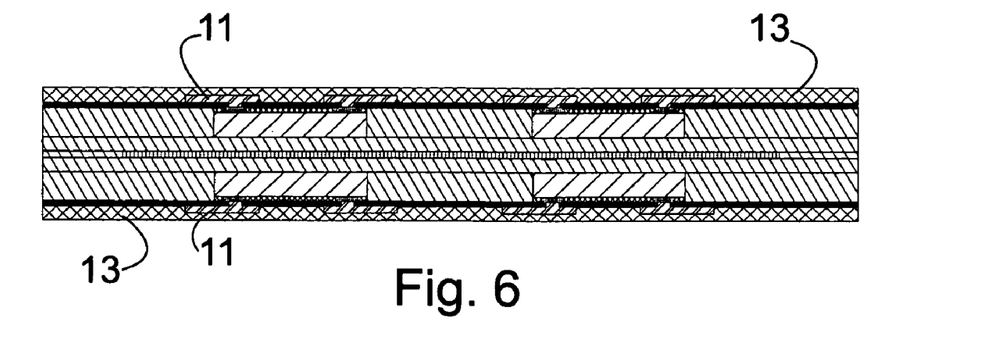
FIG. 6 is a sixth view of a schematic illustration of a method according to a first embodiment of the present invention.

To provide additional wiring patterns and to improve routing capability of the wiring board, another insulating layer, a build-up layer 13, may be fabricated over the electrical contacts 11 as presented in FIG. 6. The build-up layer 13 may be fabricated e.g. by pressing a polymeric composite layer on the structure (on each side naturally) or by e.g. using thin-film deposition techniques such as PECVD, CVD or ALD. To form another wiring pattern on the build-up layer 13 as presented in FIG. 7 similar steps are performed as when forming the electrical contacts 11 on the insulating component foil 5. I.e., vias are first formed in the build-up layer 13 by e.g. laser patterning and/or chemical etching after photolithography, to selectively expose the electrical contacts 11. The resulting structure is coated from each side by conductive material e.g. copper. This conductive coating is then patterned to form a specified wiring pattern 14 on the build-up layer 13. The conductive coating may be fabricated by e.g. electroless coating, electrolytic deposition or various thin-film deposition techniques as listed above, or by using resin coated copper e.g. as foils. Patterning of the conductive coating may be performed e.g. using laser patterning or chemical etching after photolithography. When the conductive coating is fabricated it fills the vias formed in the build-up layer 13. The surfaces of the contact regions 15 between the electrical contacts 11 and the additional wiring pattern 14 may be cleaned by e.g. laser treatment and/or chemical etching, and coated by a thin layer of different material (e.g. palladium) prior to the deposition of the conductive coating, to decrease the contact resistance between the electrical contacts 11 and the additional wiring pattern 14, and to improve the stability of the contact regions 15.

Figure 7:
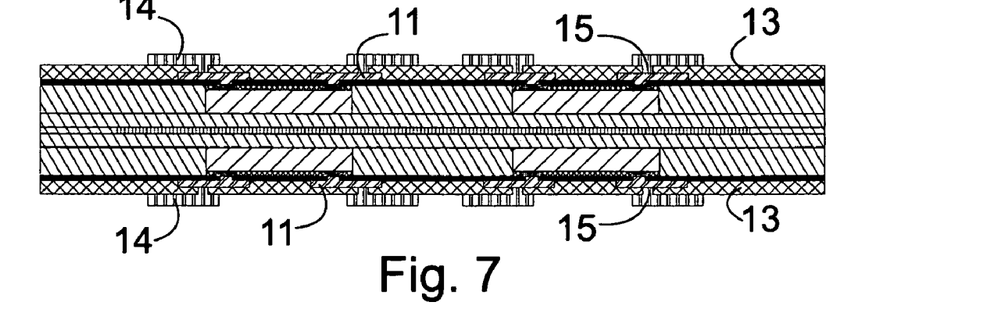
FIG. 7 is a seventh view of a schematic illustration of a method according to a first embodiment of the present invention.
Figure 8:
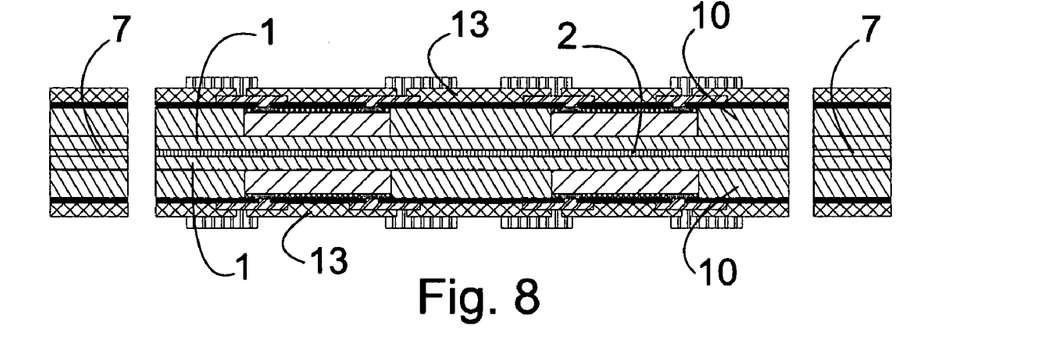
FIG. 8 is an eighth view of a schematic illustration of a method according to a first embodiment of the present invention.
Figure 9:
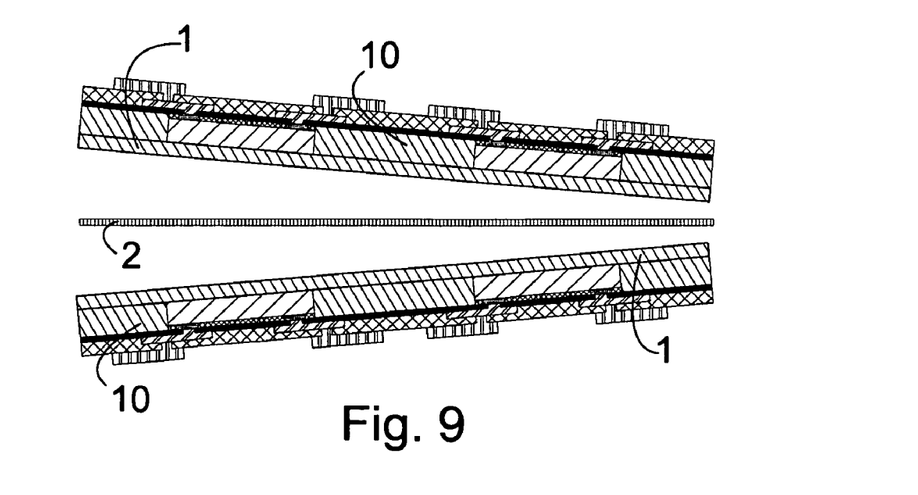
FIG. 9 is a ninth view of a schematic illustration of a method according to a first embodiment of the present invention.

When the double-sided symmetrical wiring board structure of FIG. 7 has been formed, the two sides of the structure may be separated as presented in FIGS. 8 and 9. The separation is facilitated by the planar temporary bonding means 2 separating the two sides of the double-sided wiring board structure. In practice the separation may be carried out such that the peripheral portion 7 is first removed from the entire structure. The removal of the peripheral portion 7 may be carried out using e.g. laser cutting and/or mechanical routing. The removal of the peripheral portion 7 removes the tight bonding between the two sides of the structure as the material of the planar temporary bonding means 2 is selected to prevent strong bonding of the structural layers 1 to the planar temporary bonding means 2 during the fabrication of the wiring board. After removal of the peripheral portion 7 of the double-sided structure, separation of the two sides of the wiring board may be carried out e.g. manually. The resulting two wiring boards presented in FIG. 9 may be used individually.

FIGS. 10 to 18 schematically illustrate a manufacturing process of a wiring board structure according to a second embodiment of the present invention. Each figure presents a cross sectional view of the wiring board structure in one step of the manufacturing process. The order of the figures corresponds to the order of the process steps in the manufacturing process.

Figure 10:
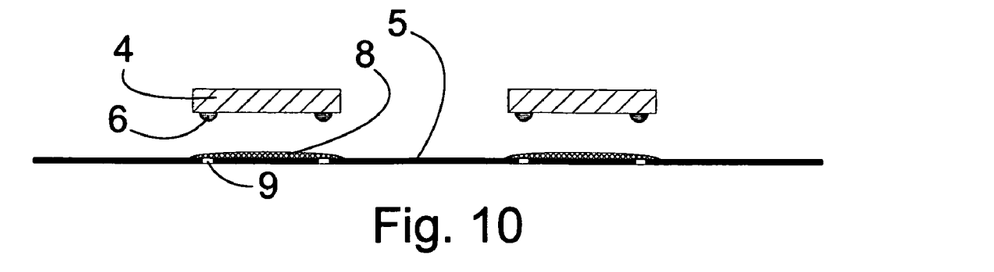
FIG. 10 is a first view of a schematic illustration of a method according to a second embodiment of the present invention.
Figure 11:
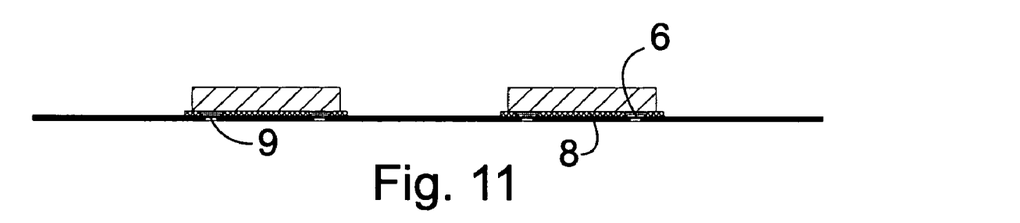
FIG. 11 is a second view of a schematic illustration of a method according to a second embodiment of the present invention.

FIGS. 10 and 11 present how an electrical component 4 is placed onto a conductive component foil 5. Epoxy resin 8 is spread onto the conductive component foil 5 in places where the electrical components 4 are to be bonded or otherwise placed to the foil 5. The electrical components 4 are placed onto the conductive component foil 5 such that the terminals 6 of the electrical components 4 face the conductive component foil 5. The conductive component foil 5 is selectively removed such that the terminals 6 of the electrical components 4 are exposed through vias 9. Formation of vias 9 in the conductive component foil 5 may be carried out before positioning the electrical components 4 on the component foil 5 or even before spreading epoxy 8 on the component foil 5. This improves alignment of the vias 9 as they may be formed during the same patterning step with alignment marks, and one is able to use one patterning step less. The vias 9 under the terminals 6 may be formed by removing the conductive component foil 5 under the terminals 6 by e.g. chemical etching after photolithography, or laser patterning.

Figure 12:
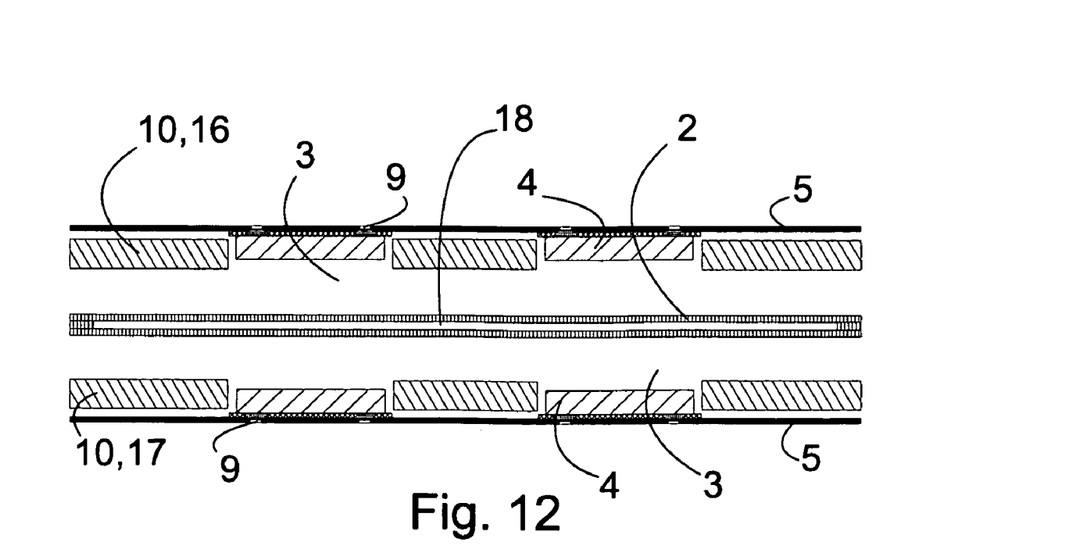
FIG. 12 is a third view of a schematic illustration of a method according to a second embodiment of the present invention.

In FIG. 12 two conductive component foils 5 comprising the bonded electrical components 4 are placed on opposite sides of a planar temporary bonding means 2 such that the terminals 6 of the electrical components 4 face away from the planar temporary bonding means 2. The conductive component foils 5 on each side of the symmetrical double-sided structure cover the structure at this stage of the manufacturing process. The planar temporary bonding means 2 in this embodiment of the invention is a planar structure in which two foils are bonded, e.g. glued, together from their edges while there is an air gap 18 separating the two foils in the middle part of the planar temporary bonding means 2.

FIG. 12 presents the geometry of the wiring board structure where slots 3 are arranged for the electrical components 4 to be embedded in the structure. The slots 3 may be arranged for e.g. individual components or for a group of components by suitably placing structural aids 10 around the electrical components 4. The structural aids 10 may be e.g. of polymeric composite or polymer. In the packaging structure according to this second embodiment the electrical components 4 are not entirely encapsulated but their back surface facing towards the planar temporary bonding means 2 remains exposed. This packaging structure may therefore be advantageous for e.g. electrical components 4 that should remain in some form of communication with the environment. These components 4 may include e.g. optoelectronic devices such as LEDs and lasers, various sensors, and MEMS components.

Figure 13:
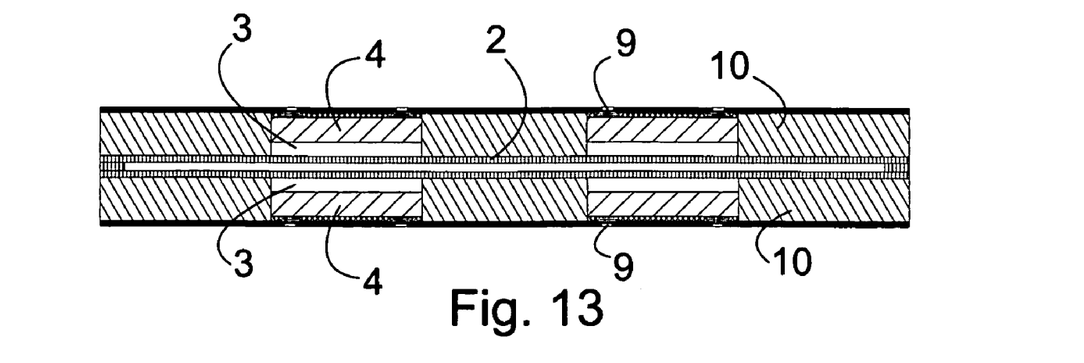
FIG. 13 is a fourth view of a schematic illustration of a method according to a second embodiment of the present invention.

As heat is applied to the layered structure of FIG. 12 and the structure is put under compressive pressure in the vertical direction, the various components of the wiring board structure presented FIG. 12, including the polymeric composite materials e.g. the structural aids 10 (comprising a first structural aid 16 and a second structural aid 17), may be bonded together via the planar temporary bonding means 2, to form a solid wiring board structure as presented in FIG. 13. The electrical components 4 are embedded in the slots 3 formed by the structural aids 10. During the application of compressive vertically directed pressure and heat, the epoxy resin or other suitable filling material in e.g. the polymeric composite of the structural aids 10 at least partially fills the slots 3 in which the electrical components 4 are embedded, and at least partially encapsulates the electrical components 4 into epoxy or the other suitable filling material. This further enforces and improves the mechanical stability of the wiring board structure. During this process step the structural aids 10 fully or partially adhere to the planar temporary bonding means 2. So called no-flow prepreg materials may be used for e.g. the structural aids 10 and/or the structural layers 1 in case full encapsulation of the electrical components 4 is not desired. This may be the case when an area of an electrical component 4 (in the case of e.g. LEDs, lasers, sensors and MEMS devices) is to be left exposed to the environment. These no-flow materials do not incorporate material that would flow into the slots 3 during the heat treatment and the application of pressure.

Figure 14:
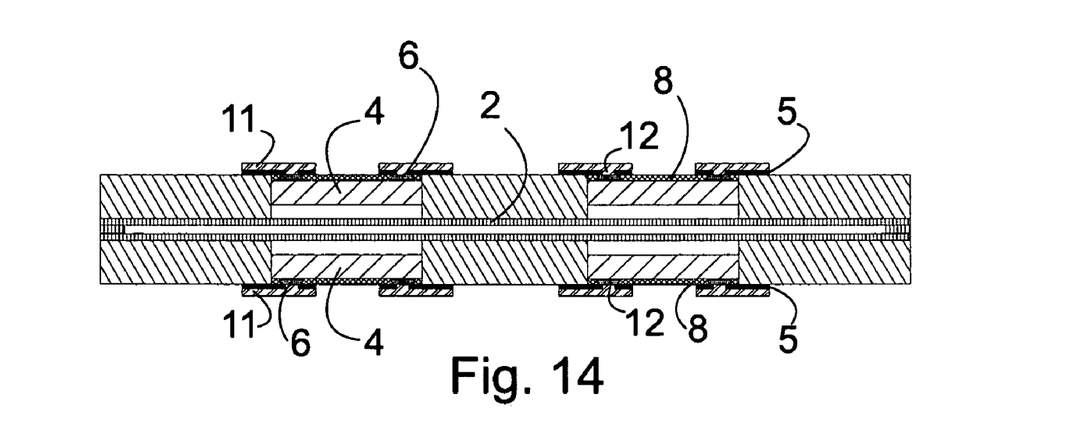
FIG. 14 is a fifth view of a schematic illustration of a method according to a second embodiment of the present invention.

In the structure of FIG. 14 electrical contacts 11 are fabricated to the exposed terminals 6 of the electrical components 4. This has been done by coating the structure of FIG. 13 from each side by a conductive layer e.g. copper, and patterning the conductive layer and the conductive component foil 5 to form a specified wiring pattern and/or electrical contacts 11. The conductive component foil 5 and the conductive layer above the conductive component foil 5 may be patterned using the same lithographic mask to yield the electrical contacts 11. The conductive layer may be deposited over the whole surface of the wiring board structure by e.g. electroless plating of copper to yield the electrical contacts 11.

In another embodiment of the invention, a modification to the second embodiment of the invention, a second conductive layer may subsequently be deposited on the resist layer used in the patterning of the electrical contacts 11. In this embodiment the aforementioned resist layer serves the purpose of the build-up layer 13, and the second conductive layer may be patterned to yield a wiring pattern corresponding to the wiring pattern 14. In this case contacting between the wiring pattern and the electrical contacts 11 is formed on a vertical side of the electrical contacts 11.

The conductive layer electrically contacts the terminals 6 of the electrical component 4 to the conductive component foil 5. The conductive layer may be fabricated by e.g. electroless coating, electrolytic deposition or various thin-film deposition techniques such as CVD or PECVD. Patterning of the conductive layer and the conductive component foil 5 may be performed e.g. using laser patterning, pattern plating or chemical etching after photolithography. During the fabrication of the electrical contacts 11 the conductive layer fills the vias 9 formed in the conductive component foil 5. The surfaces of the contact regions 12 may be cleaned by e.g. laser treatment and/or chemical etching, and coated by a thin layer of different material (e.g. palladium) prior to the deposition of the conductive layer, to decrease the contact resistance and to increase adhesion of the electrical contacts 11 and to improve their stability.

Figure 15:
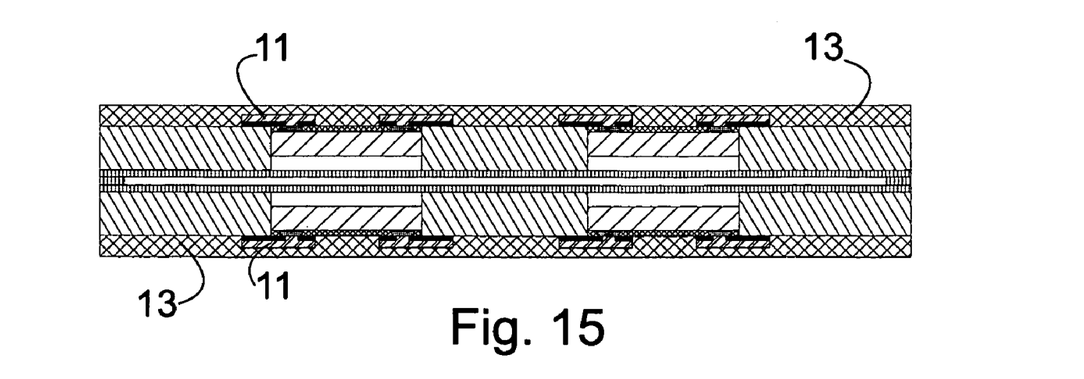
FIG. 15 is a sixth view of a schematic illustration of a method according to a second embodiment of the present invention.

To provide additional wiring patterns and to improve routing capability of the wiring board, another insulating layer, a build-up layer 13, may be fabricated over the electrical contacts 11 as presented in FIG. 15. The build-up layer 13 may be fabricated e.g. by pressing a polymeric composite layer on the structure (on each side naturally) or by e.g. using thin-film deposition techniques such as PECVD, CVD or ALD.

Figure 16:
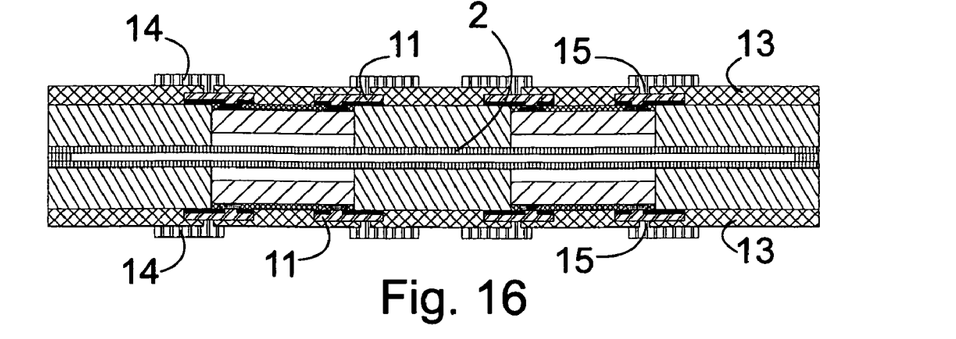
FIG. 16 is a seventh view of a schematic illustration of a method according to a second embodiment of the present invention.

To form another wiring pattern on the buildup layer 13 as presented in FIG. 16 similar steps are performed as when forming the electrical contacts 11 on the conductive component foil 5. I.e., vias are first formed in the build-up layer 13 by e.g. laser patterning and/or chemical etching after photolithography, to selectively expose the electrical contacts 11. The resulting structure is coated (from each side naturally) by conductive material e.g. copper. This conductive coating is then patterned to form a specified wiring pattern 14 on the build-up layer 13. The conductive coating may be fabricated by e.g. electroless coating, electrolytic deposition or various thin-film deposition techniques as listed above, or by using resin coated copper e.g. as foils. Patterning of the conductive coating may be performed e.g. using laser patterning or chemical etching after photolithography. When the conductive coating is fabricated it fills the vias formed in the build-up layer 13. The surfaces of the contact regions 15 between the electrical contacts 11 and the additional wiring pattern 14 may be cleaned by e.g. laser treatment and/or chemical etching, and coated by a thin layer of different material (e.g. palladium) prior to the deposition of the conductive coating, to decrease the contact resistance between the electrical contacts 11 and the additional wiring pattern 14, and to improve the stability of the contact regions 15.

Figure 17:
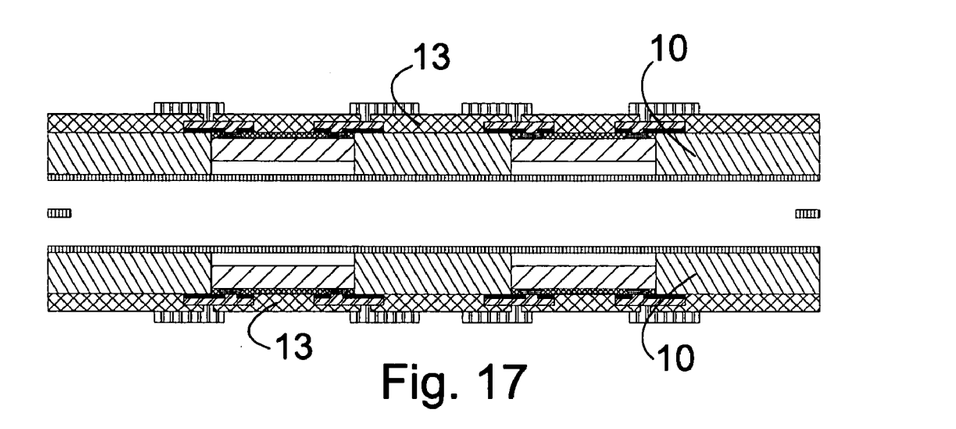
FIG. 17 is an eighth view of a schematic illustration of a method according to a second embodiment of the present invention.
Figure 18:
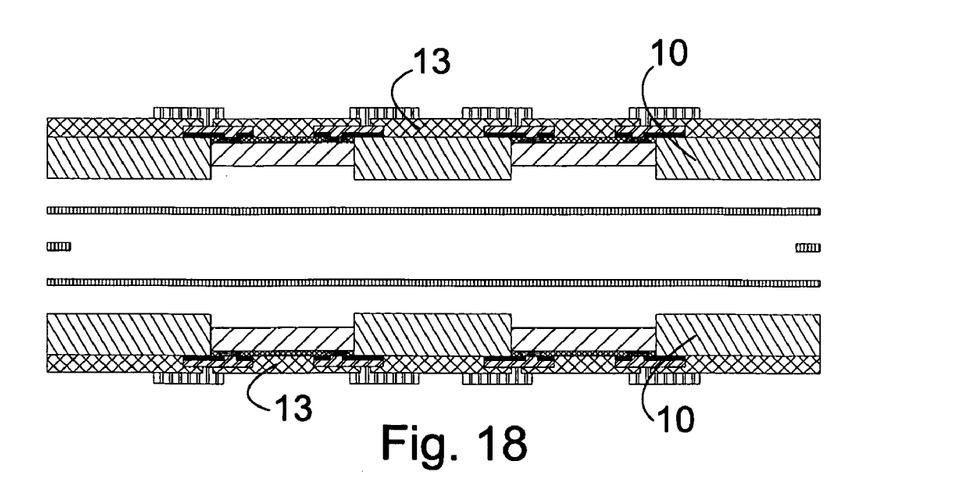
FIG. 18 is a ninth view of a schematic illustration of a method according to a second embodiment of the present invention.

When the double-sided symmetrical wiring board structure of FIG. 16 has been formed, the two sides of the structure may be separated as presented in FIGS. 17 and 18. The separation is made possible by the planar temporary bonding means 2 separating the two sides of the double-sided wiring board structure. Separation of the two sides of the wiring board may be done e.g. manually. The resulting two wiring boards presented in FIG. 18 may be used individually.

When the separation is carried out the mutual bonding of the two foils in the layered temporary bonding means 2 is broken from the sides and the foils may remain attached to the wiring board structure of their respective side, as presented in FIG. 17. The foils may then be removed from the two wiring boards to expose a surface of the electrical components 4 to the environment, as presented in FIG. 18.

In another embodiment of the invention the two foils of the planar layered temporary bonding means 2 of e.g. FIG. 12 may remain as part of the wiring board structure as presented in FIG. 17, in case no exposure of the embedded electrical components 4 is desired. In this case the two foils of the layered planar temporary bonding means 2 are structurally similar to the structural layers 1 presented in the first embodiment in e.g. FIG. 3, and the planar temporary bonding means 2 may be regarded simply as an air gap 18 in between the two structural layers 1 glued together from the sides. In a structure like this the structural layers 1 may be of e.g. hard plastic material or metal as mutual adhesion of the two structural layers 1 is achieved by e.g. gluing the layers 1 together from the sides.

Figure 19A:
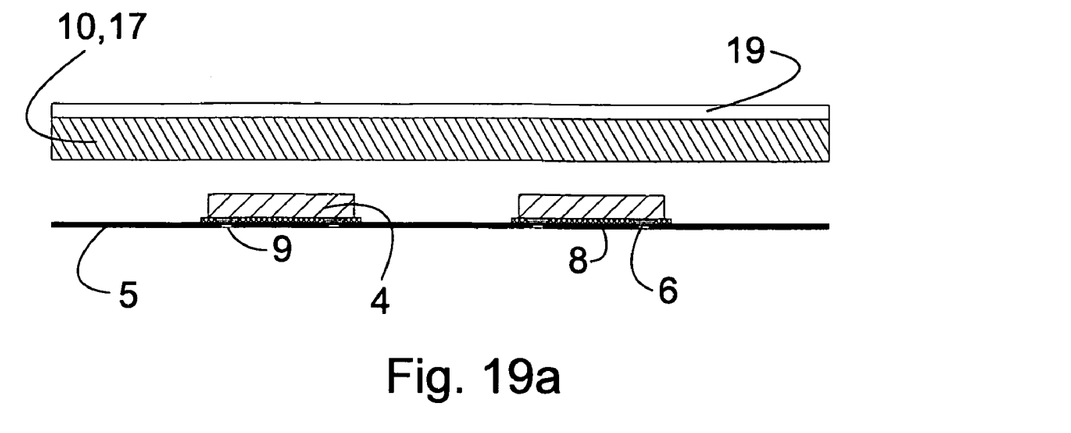
FIG. 19a is a first view of a schematic illustration of a method according to a third embodiment of the present invention.
Figure 19B:
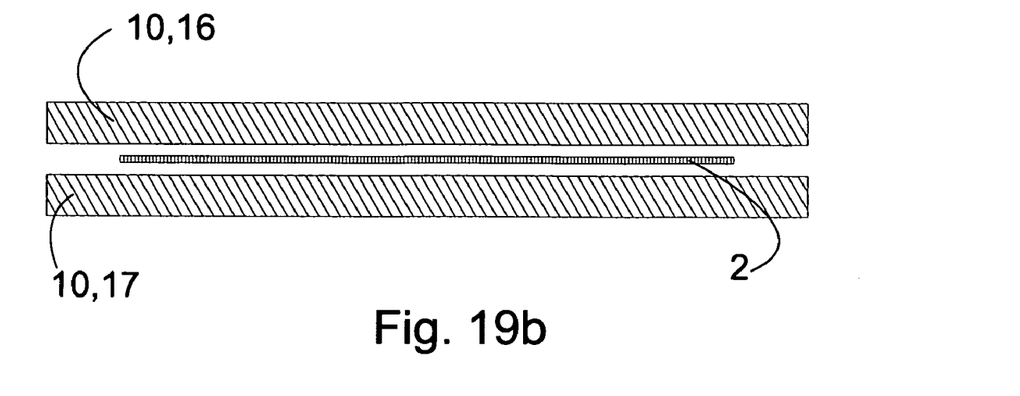
FIG. 19b is a first view of a schematic illustration of a method according to a fourth embodiment of the present invention.
Figure 20A:
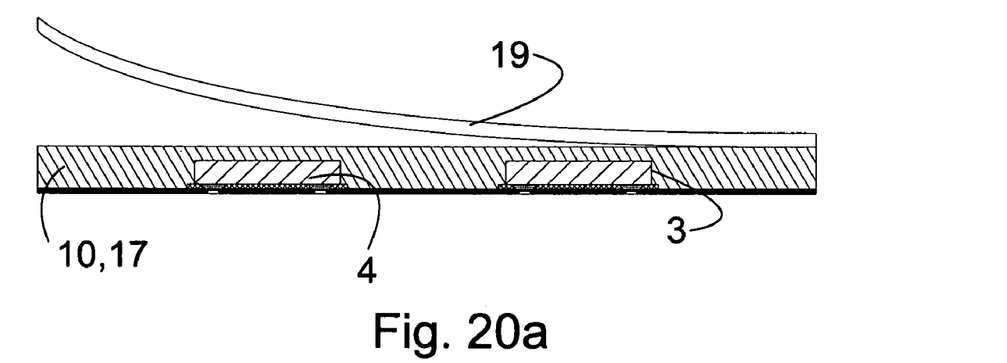
FIG. 20a is a second view of a schematic illustration of a method according to a third embodiment of the present invention.
Figure 20B:
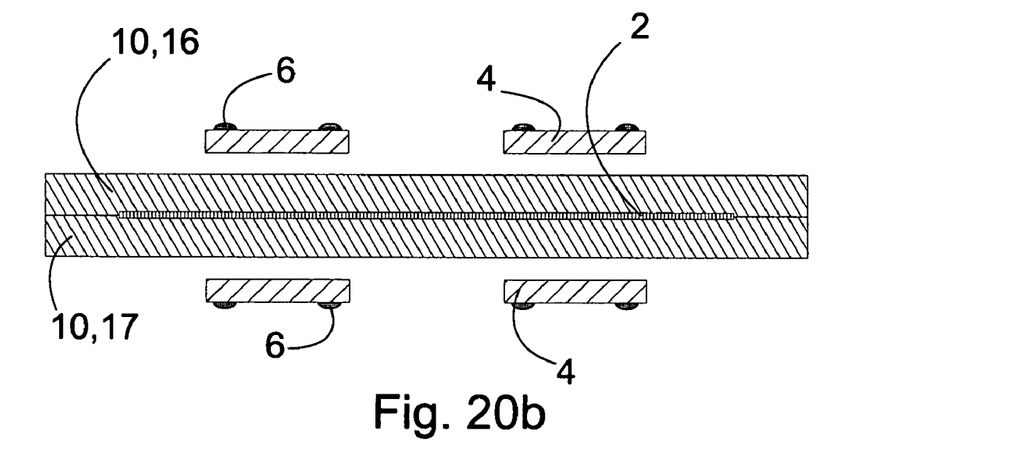
FIG. 20b is a second view of a schematic illustration of a method according to a fourth embodiment of the present invention.
Figure 21A:
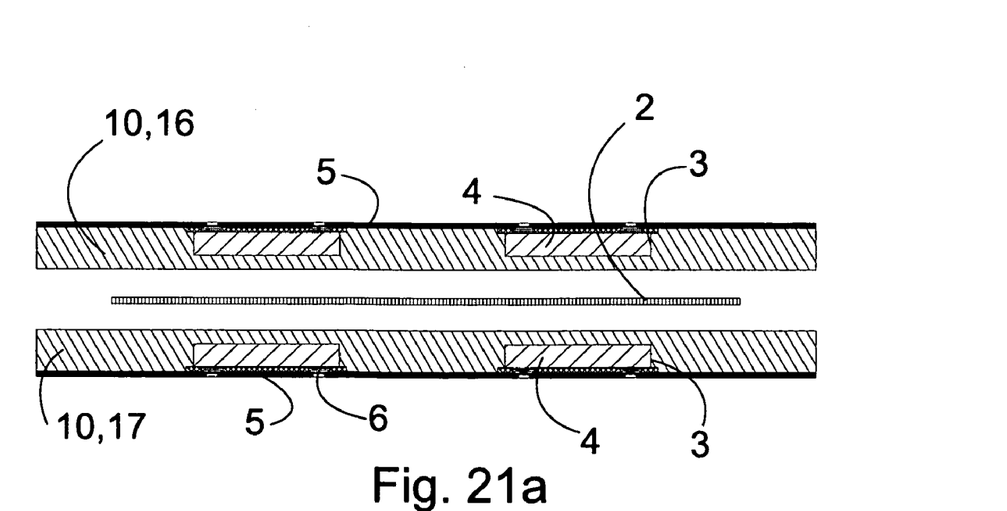
FIG. 21a is a third view of a schematic illustration of a method according to a third embodiment of the present invention.

FIGS. 19a, 20a and 21a schematically illustrate the first stages of a manufacturing process of a wiring board structure according to a third embodiment of the present invention. The process flow of the third embodiment of the present invention may continue e.g. corresponding to FIGS. 23-27. This will be obvious for a person skilled in the art in light of this disclosure. FIGS. 19b, 20b, 21b and 22-27 schematically illustrate a manufacturing process of a wiring board structure according to a fourth embodiment of the present invention. Each figure presents a cross sectional view of the wiring board structure in one step of the manufacturing process. Apart from FIGS. 19a-21a and FIGS. 19b-21b which show alternative embodiments of the invention, the order of the figures corresponds to the order of the process steps in the manufacturing process.

In the third and fourth embodiments of the invention, presented by FIGS. 19-27, only one structural aid 10 is employed on each side of the planar temporary bonding means 2. This is made possible by using a molding resin sheet as the structural aid 10. In these embodiments an electrical component 4 may be embedded in a slot 3 by simply pressing the electrical component 4 in the structural aid 10 and by treating the structural aid (the molding resin sheet) 10 e.g. thermally. In this way the slot 3 for the electrical component 4 is formed in the structural aid 10 which shapes according to the shape of the electrical component 4. As heat is applied to the molding resin sheet and a structure comprising these sheets is put under compressive pressure in the vertical direction (the direction which is perpendicular to the plane of the board-like structure), the various components of the wiring board structure may be merged together to form a solid structure. Heat causes the epoxy material incorporated in the molding resin sheet to become fluid, and the whole sheet softens. When an electrical component 4 is now pressed against the structural aid 10 the molding resin sheet conforms to the shape of the component forming a slot 3 for the electrical component 4. This at least partially encapsulates the electrical component 4 in the slot 3 into the epoxy of the molding resin sheet. As the epoxy is cured a solid structure is obtained.

The molding resin sheet comprises polymeric composite with thermoplastic material such as epoxy resin. The precise composition of the material of the molding resin sheet can vary as long as the material allows for shaping to conform to the shape of the electrical component 4.

As presented in FIG. 19a, similarly to FIG. 10 and FIG. 11 of the second embodiment of the invention, in the third embodiment of the invention the electrical component 4 is first mounted on a conductive component foil 5, the terminals 6 of the electrical component 4 facing the component foil 5. Epoxy resin 8 is used to attach the electrical component 4 to the component foil 5, and vias 9 are formed in the component foil 5 to expose the terminals 6. The structural aid 10 being a molding resin sheet initially has a protective PET-film 19 laminated on its surface. This PET-film 19 is peeled away after embedding the electrical component 4 in the structural aid 10, as presented in FIG. 20a. The electrical component 4 is embedded in the slot 3 in the structural aid 10 by pressing the component foil against the structural aid 10 while heating the structural aid 10, as described above.

In FIG. 21a two conductive component foils 5, comprising the embedded electrical components 4 in the slot 3 in the structural aid 10, are placed on opposite sides of a planar temporary bonding means 2 such that the terminals 6 of the electrical components 4 face away from the planar temporary bonding means 2. The two structures, as presented in FIG. 20a, are pressed and annealed on each side of a planar temporary bonding means 2 to obtain an essentially symmetrical double-sided structure. The conductive component foils 5 on each side of this essentially symmetrical double-sided structure cover the structure at this stage of the manufacturing process. This is presented in FIG. 21a and FIG. 22.

Figure 21B:
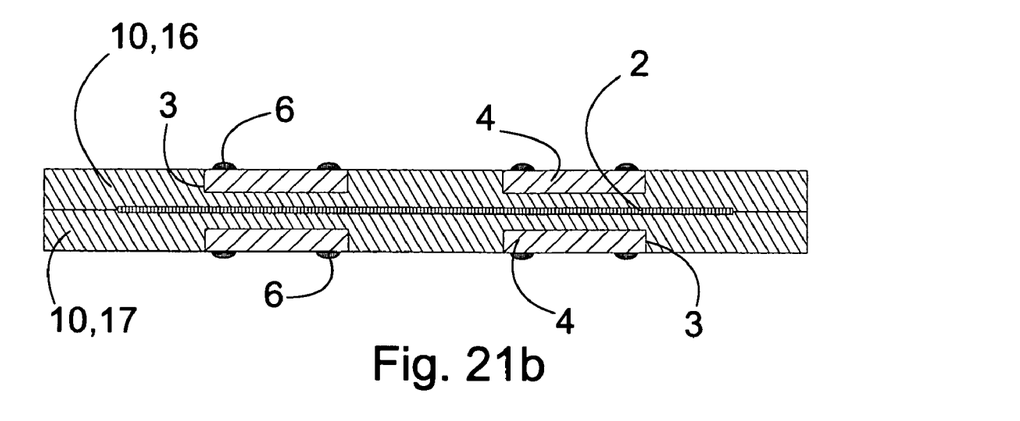
FIG. 21b is a third view of a schematic illustration of a method according to a fourth embodiment of the present invention.
Figure 22:
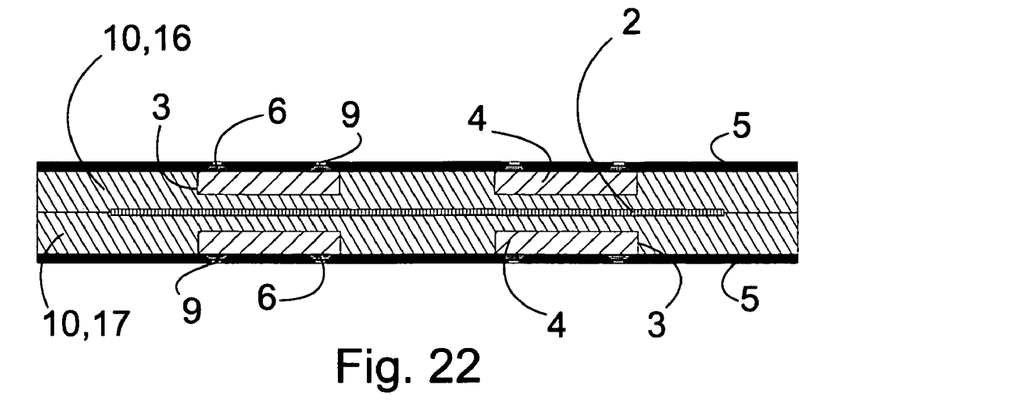
FIG. 22 is a fourth view of a schematic illustration of a method according to a fourth embodiment of the present invention.

An alternative way of obtaining a symmetrical double-sided structure corresponding to the structure of FIG. 22 is presented in FIGS. 19b, 20b, 21b and 22. In this fourth embodiment of the present invention two structural aids 10 (molding resin sheets) are pressed on a planar temporary bonding means 2, one on each side (FIG. 19b), to form an essentially symmetrical double-sided structure. Subsequently electrical components 4 are pressed against the structural aids 10, the terminals 6 of the electrical components 4 facing away from the planar temporary bonding means 2, to embed the electrical components 4 into the structural aids 10 (FIG. 20b and FIG. 21b), as described above. During this embedding step the electrical components 4 may be individually embedded as shown in FIG. 20b or they may be attached to a supporting film which is then removed from the electrical components 4 after the embedding step. After the electrical components 4 have been embedded and the possible supporting film has been removed, the structure of FIG. 21b is coated with a conductive film, i.e. a conductive component foil 5 and vias 9 are formed in the component foil 5 to expose the terminals 6. The conductive coating forming the component foil 5 can be deposited on the electrical components 4 and their terminals 6 by e.g. electroless coating, electrolytic deposition or various thin-film deposition techniques such as CVD or PECVD; a structure as presented in FIG. 22 is obtained. The vias 9 can be formed as described above.

The structural aids 10 in the third and fourth embodiments (i.e. the molding resin sheets) have a larger surface area than the planar temporary bonding means 2 such that the peripheral portion of the structural aids 10 extends outside the planar temporary bonding means 2. The planar temporary bonding means 2 in these embodiments of the invention can be a foil having a suitable adhesion or no adhesion to the structural aids 10. This adhesion may be weak or even close to zero to the structural aids 10 to enable a relatively effortless separation of the two sides of the essentially symmetrical double-side structure at a later stage of the manufacturing process.

Figure 23:
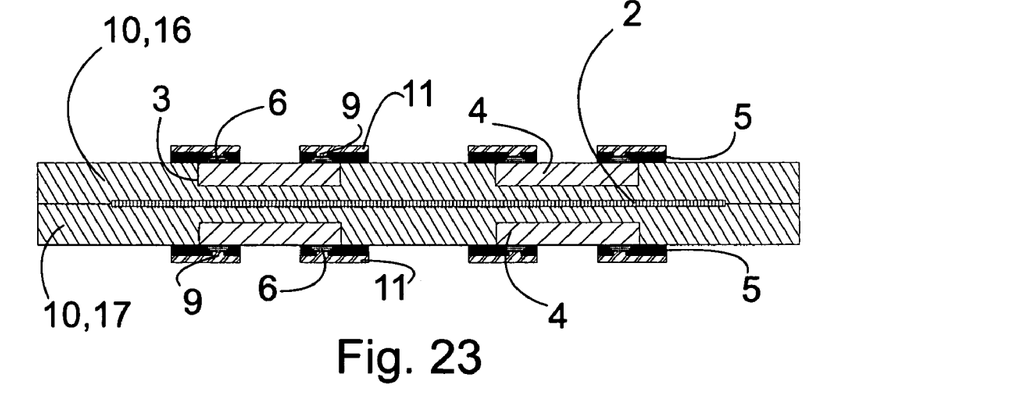
FIG. 23 is an fifth view of a schematic illustration of a method according to a fourth embodiment of the present invention.
Figure 24:
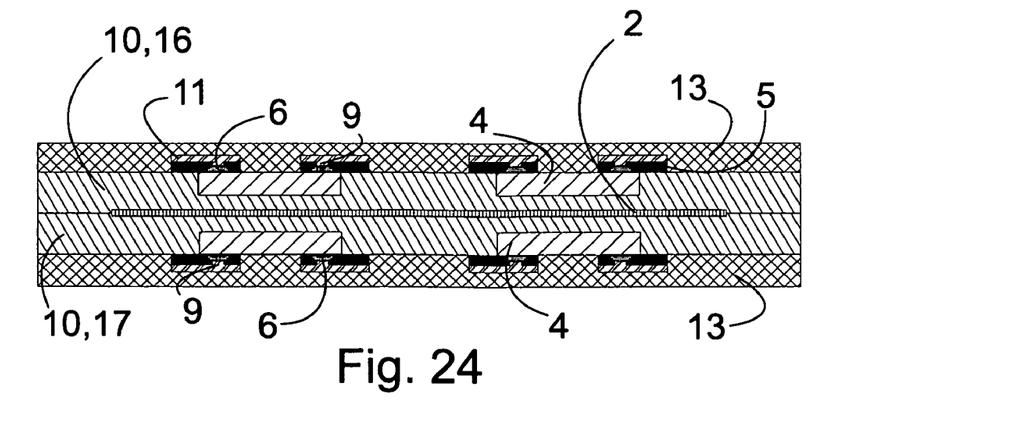
FIG. 24 is a sixth view of a schematic illustration of a method according to a fourth embodiment of the present invention.

In the structure of FIG. 23 electrical contacts 11 are fabricated to the exposed terminals 6 of the electrical components 4. This has been done by coating the structure of FIG. 22 from each side by a conductive layer e.g. copper, and patterning the conductive layer and the conductive component foil 5 to form a specified wiring pattern and/or electrical contacts 11. The conductive component foil 5 and the conductive layer above the conductive component foil 5 may be patterned using the same lithographic mask to yield the electrical contacts 11. The conductive layer may be deposited over the whole surface of the wiring board structure by e.g. electroless plating of copper. To provide additional wiring patterns and to improve routing capability of the wiring board, another insulating layer, a build-up layer 13, may be fabricated over the electrical contacts 11 as presented in FIG. 24.

The processing steps in the fourth embodiment, for forming a wiring pattern and/or electrical contacts to the terminals 6 of the electrical components 4, are analogous to the corresponding processing steps of e.g. the second embodiment. These processing steps, as presented in FIGS. 14-16 of the second embodiment, correspond to FIGS. 23-25 of the fourth embodiment.

Figure 25:
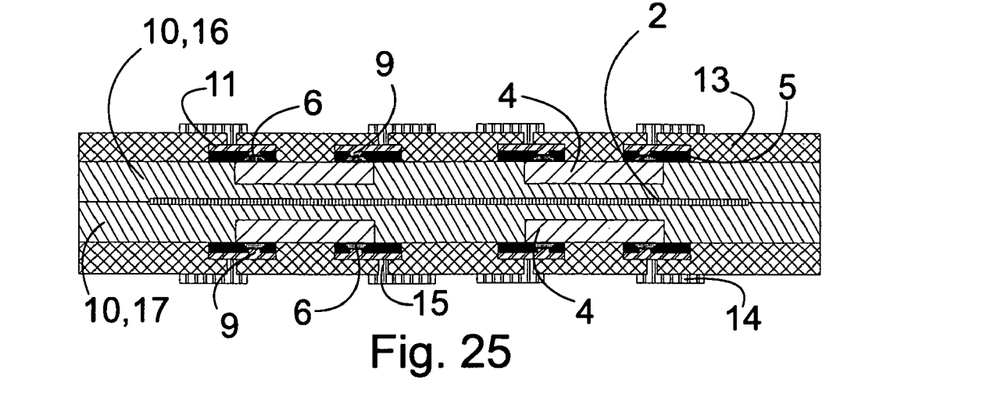
FIG. 25 is a seventh view of a schematic illustration of a method according to a fourth embodiment of the present invention.
Figure 26:
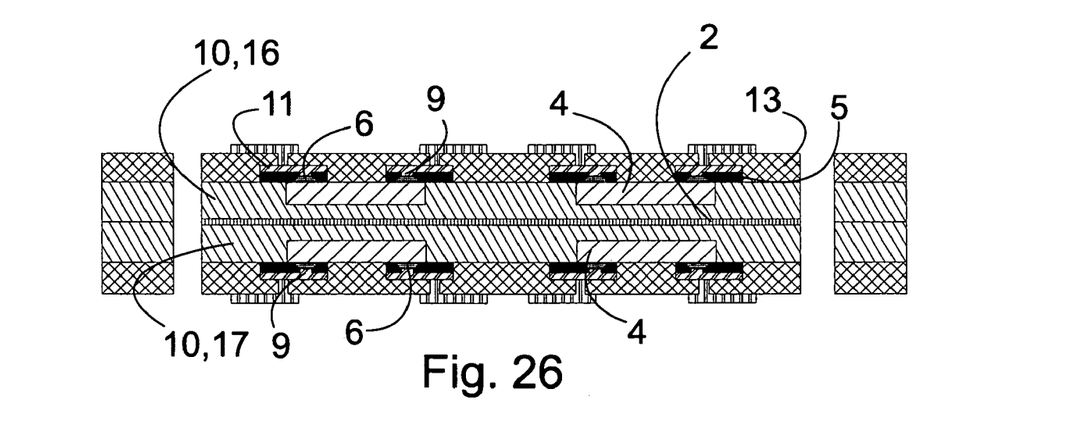
FIG. 26 is an eighth view of a schematic illustration of a method according to a fourth embodiment of the present invention.
Figure 27:
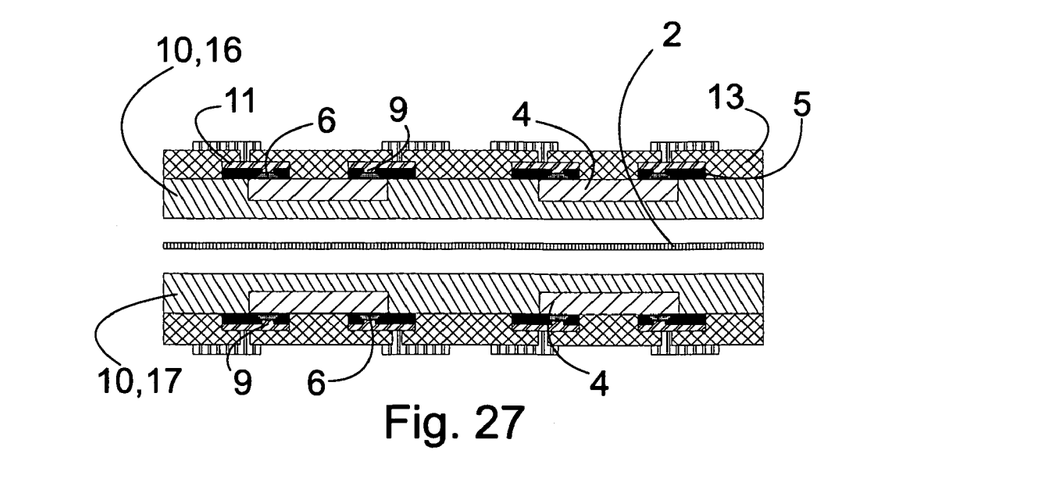
FIG. 27 is a ninth view of a schematic illustration of a method according to a fourth embodiment of the present invention.

When the double-sided symmetrical wiring board structure of FIG. 25 has been formed, the two sides of the structure may be separated as presented in FIG. 26 and FIG. 27. The easy separation is made possible by the planar temporary bonding means 2 separating the two sides of the double-sided wiring board structure. Separation of the two sides of the wiring board may be done e.g. manually, after removing the peripheral portions of the structure at which the first 16 and the second 17 structural aids are bonded together (FIG. 26). The resulting two wiring boards presented in FIG. 27 may be used individually.

The exact structure of the planar temporary bonding means 2 in the embodiments presented above may vary. The bonding means 2 may be e.g. a simple foil as in the first embodiment, or a layered structure as in the second embodiment. The planar temporary bonding means 2 is designed to facilitate the separation of the two sides of the symmetrical double-sided wiring board structure 2. The bonding means 2 may furthermore be designed to temporarily bond together the two sides of the essentially symmetrical double-sided structure from one or more points around the middle part of the planar structure. The desired adhesion properties of the simple foil may vary from non-adhering to fully adhering depending on the wiring board structure and on the manufacturing process. The foil may also e.g. fully adhere on the surrounding structures but by a suitable heat treatment the foil may be broken down to release the sides of the double-sided structure from each other. In one embodiment of the invention the planar temporary bonding means 2 may be realized by curing the structural layers 1, made of prepreg material, before pressing them together. In this embodiment a release foil (or any other structure) is not needed in between the structural layers 1, since the already cured resin in the prepreg material does not cause the structural layers 1 to bond to each other during subsequent processing steps. In this case, the structural aids 10 may be shaped such that they may, for further processing, temporarily bond the two sides of the double-sided structure together from the peripheral portions of the structure.

The wiring board structures in the embodiments of the invention disclosed above remain essentially symmetrical through those process steps, which require significant heat treatment. In this way the warping of the embedded structure may be minimized. This is important for an embedded structure in which electrical components reside inside the wiring board structure and may therefore be very sensitive to variations in the shape of the structure. Warping may be minimized by keeping the coefficients of thermal expansion similar for each side of the double-sided structure. This does not necessarily imply that the wiring pattern on each side should be identical. Therefore it is possible to design different wiring patterns on different sides of the structure. In addition to reducing warping the embodiments of the invention presented in FIGS. 1 to 27 may be used to essentially double the throughput of a production line as two wiring boards may be obtained from a single double-sided structure. The embedded structure furthermore improves the mechanical and electrical stability of the wiring boards and increases the packaging density of electrical components 4 in the wiring boards.

As is clear for a person skilled in the art, the invention is not limited to the examples described above but the embodiments can freely vary within the scope of the claims.

The invention claimed is:

1. A method for manufacturing a wiring board, wherein the method comprises the steps of
    mounting at least one structural aid on each side of a planar temporarily used bonding means,
    creating a slot for an electrical component from the at least one structural aid on each side of the planar temporarily used bonding means,
    embedding the electrical component in the slot, such that the terminals of the electrical component are located on the side farthest from the planar temporarily used bonding means,
    mounting at least one electrical component on a foil, such that the terminals of the electrical component are in contact with the foil,
    mounting the component foil at least partially on the at least one structural aid, on each side of the planar temporarily used bonding means, and
    separating the at least one structural aids on each side of the planar temporarily used bonding means from each other.

2. The method of claim 1, wherein the structural aid is a molding resin sheet, for embedding the electrical component into the slot in the molding resin sheet.

3. The method of claim 1, wherein the planar temporarily used bonding means is a foil.

4. The method of claim 1, wherein the method comprises a step of
    mounting a structural layer on each side of the planar temporarily used bonding means in between the at least one structural aid and the planar temporarily used bonding means.

5. The method of claim 4, wherein the surface area of the planar temporarily used bonding means is smaller than the surface area of the structural layer mounted on each side of the planar temporarily used bonding means, such that the structural layers on each side of the planar temporarily used bonding means are in direct contact with each other at a peripheral portion of the structural layers.

6. The method of claim 4, wherein the method comprises a step of
    bonding the structural layers on each side of the planar temporarily used bonding means together at a peripheral portion of the structural layers.

7. The method of claim 1, wherein the structural layers and/or the at least one structural aid are polymer or polymeric composite.

8. The method of claims 1, wherein the method comprises a step of
    at least partly encapsulating the at least one electrical component in filling material by heat-treating the structural layer and/or the at least one structural aid in which the at least one electrical component is embedded.

* * * * *